(12) United States Patent
Fujisawa et al.

(10) Patent No.: US 11,705,432 B2
(45) Date of Patent: Jul. 18, 2023

(54) STACKED DIE PACKAGE INCLUDING A FIRST DIE COUPLED TO A SUBSTRATE THROUGH DIRECT CHIP ATTACHMENT AND A SECOND DIE COUPLED TO THE SUBSTRATE THROUGH WIRE BONDING, AND RELATED METHODS AND DEVICES

(71) Applicant: Micron Technology, Inc., Boise, ID (US)

(72) Inventors: Hiroki Fujisawa, Tokyo (JP); Raj K. Bansal, Taichung (TW); Shunji Kuwahara, Tokyo (JP); Mitsuaki Katagiri, Tokyo (JP); Satoshi Isa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/365,741

(22) Filed: Jul. 1, 2021

(65) Prior Publication Data
US 2021/0327856 A1    Oct. 21, 2021

Related U.S. Application Data

(62) Division of application No. 16/553,549, filed on Aug. 28, 2019, now Pat. No. 11,081,468.

(51) Int. Cl.
*G11C 5/04* (2006.01)
*H01L 25/065* (2023.01)
(Continued)

(52) U.S. Cl.
CPC ...... *H01L 25/0657* (2013.01); *G11C 11/4096* (2013.01); *H01L 24/07* (2013.01);
(Continued)

(58) Field of Classification Search
CPC ..... H01L 25/0657; H01L 24/07; H01L 25/18; H01L 25/50; H01L 24/48; H01L 24/16;
(Continued)

(56) References Cited

U.S. PATENT DOCUMENTS

| 5,994,166 A | 11/1999 | Akram et al. |
| 6,127,726 A | 10/2000 | Bright et al. |

(Continued)

FOREIGN PATENT DOCUMENTS

| CN | 102763217 A | 10/2012 |
| CN | 104054172 A | 9/2014 |

(Continued)

OTHER PUBLICATIONS

International Search Report for Application No. PCT/US2020/070114, dated Sep. 18, 2020, 4 pages.

(Continued)

*Primary Examiner* — Mushfique Siddique
(74) *Attorney, Agent, or Firm* — TraskBritt

(57) ABSTRACT

Systems, apparatuses, and methods using wire bonds and direct chip attachment (DCA) features in stacked die packages are described. A stacked die package includes a substrate and at least a first semiconductor die and a second semiconductor die that are vertically stacked above the substrate. An active surface of the first semiconductor die faces an upper surface of the substrate and the first semiconductor die is operably coupled to the substrate by direct chip attachment DCA features. A back side surface of the second semiconductor die faces a back side surface of the first semiconductor die. The second semiconductor die is operably coupled to the substrate by wire bonds extending between an active surface thereof and the upper surface of the substrate.

18 Claims, 10 Drawing Sheets

(51) Int. Cl.
  *H01L 25/00* (2006.01)
  *H01L 23/00* (2006.01)
  *G11C 11/4096* (2006.01)
  *H01L 25/18* (2023.01)

(52) U.S. Cl.
  CPC ............ H01L 24/16 (2013.01); H01L 24/48 (2013.01); H01L 25/50 (2013.01); *H01L 25/18* (2013.01); *H01L 2224/0233* (2013.01); *H01L 2224/02373* (2013.01); *H01L 2224/02375* (2013.01); *H01L 2224/02381* (2013.01); *H01L 2224/16225* (2013.01); *H01L 2224/48145* (2013.01); *H01L 2224/48225* (2013.01); *H01L 2225/0651* (2013.01); *H01L 2225/06506* (2013.01); *H01L 2225/06517* (2013.01); *H01L 2225/06527* (2013.01); *H01L 2225/06558* (2013.01); *H01L 2225/06562* (2013.01); *H01L 2225/06565* (2013.01)

(58) Field of Classification Search
  CPC . H01L 2225/06527; H01L 2224/02373; H01L 2225/06558; H01L 2225/06565; H01L 2224/0233; H01L 2224/48225; H01L 2224/02381; H01L 2225/06506; H01L 2224/16225; H01L 2225/06562; H01L 2225/0651; H01L 2225/06517; H01L 2224/48145; H01L 2224/02375; G11C 11/4096
  See application file for complete search history.

(56) References Cited

U.S. PATENT DOCUMENTS

| | | | |
|---|---|---|---|
| 6,313,522 B1 | 11/2001 | Akram et al. | |
| 8,629,546 B1 | 1/2014 | Scanlan | |
| 9,401,183 B2 | 7/2016 | Leedy | |
| 9,811,122 B2 * | 11/2017 | Kwon | H01L 25/0655 |
| 2006/0012020 A1 | 1/2006 | Gilleo | |
| 2007/0045812 A1 | 3/2007 | Heng | |
| 2008/0203575 A1 | 8/2008 | Thomas et al. | |
| 2009/0236733 A1 | 9/2009 | Chow et al. | |
| 2009/0309204 A1 | 12/2009 | Ha | |
| 2010/0059873 A1 | 3/2010 | Chow et al. | |
| 2010/0061056 A1 | 3/2010 | Searls et al. | |
| 2011/0193243 A1 * | 8/2011 | Gupta | H01L 23/66 257/E23.116 |
| 2013/0134607 A1 * | 5/2013 | Gillingham | H01L 25/0657 257/782 |
| 2013/0256917 A1 | 10/2013 | Kim et al. | |
| 2015/0325560 A1 * | 11/2015 | Fai | H01L 23/5283 438/109 |
| 2016/0093525 A1 | 3/2016 | Cook et al. | |
| 2016/0148904 A1 | 5/2016 | Zhai et al. | |
| 2018/0350776 A1 * | 12/2018 | Ye | G06F 13/1694 |
| 2019/0013294 A1 | 1/2019 | Sasaki et al. | |

FOREIGN PATENT DOCUMENTS

| | | |
|---|---|---|
| CN | 105679749 A | 6/2016 |
| CN | 105074918 B | 12/2017 |
| KR | 10-2015-0144305 A | 12/2015 |

OTHER PUBLICATIONS

Written Opinion of the International Searching Authority for Application No. PCT/US2020/070114, dated Sep. 18, 2020, 10 pages.
Chinese First Office Action for Application No. 202080058403.5 dated Aug. 24, 2022, 19 pages.
Chinese Second Office Action for Chinese Application No. 202080058403.5, dated Mar. 10, 2023, 19 pages with translation.

* cited by examiner

600

```
┌─────────────────────────────────────────────────┐
│ Dispose a first integrated circuit die over a   │
│ substrate with an active surface of the first   │
│ integrated circuit die facing an upper surface  │
│ of the substrate                                │
│                      610                        │
└─────────────────────────────────────────────────┘
                         │
                         ▼
┌─────────────────────────────────────────────────┐
│ Electrically couple the first integrated        │
│ circuit die to the substrate via direct chip    │
│ attachment (DCA) features                       │
│                      620                        │
└─────────────────────────────────────────────────┘
                         │
                         ▼
┌─────────────────────────────────────────────────┐
│ Dispose a second integrated circuit die over    │
│ the first integrated circuit die with a back    │
│ side surface of the second integrated circuit   │
│ die facing a back side surface of the first     │
│ integrated circuit die                          │
│                      630                        │
└─────────────────────────────────────────────────┘
                         │
                         ▼
┌─────────────────────────────────────────────────┐
│ Electrically couple the second integrated       │
│ circuit die to the substrate via first wire     │
│ bonds                                           │
│                      640                        │
└─────────────────────────────────────────────────┘
```

Receive a read or write signals at a first memory die of a stacked die package from a substrate of the stacked die package, wherein an active surface of the first memory die faces an upper surface of the substrate
710

Transmit the read or write signals from the first memory die to a second memory die of the stacked die package via the substrate, wherein the second memory die is located over the first memory die
720

FIG. 7

STACKED DIE PACKAGE INCLUDING A FIRST DIE COUPLED TO A SUBSTRATE THROUGH DIRECT CHIP ATTACHMENT AND A SECOND DIE COUPLED TO THE SUBSTRATE THROUGH WIRE BONDING, AND RELATED METHODS AND DEVICES

CROSS-REFERENCE TO RELATED APPLICATION

This application is a divisional of U.S. patent application Ser. No. 16/553,549, filed Aug. 28, 2019, now U.S. Pat. No. 11,081,468, issued Aug. 3, 2021, the contents and disclosure of which is hereby incorporated herein in its entirety by this reference.

TECHNICAL FIELD

Embodiments of the disclosure relate to a stacked die package including wire bonding and direct chip attachment (DCA), and more specifically, a stacked die package configured for transferring signals between a master die and a slave die of the a stacked die package via a substrate of the stacked die package. Other embodiments relate to methods of forming a stacked die package that includes a master die coupled to a substrate via DCA features and one or more slave die coupled to the substrate via wire bonding, and related memory modules, memory devices, semiconductor devices, and systems.

BACKGROUND

Stacked semiconductor packages (e.g., 3-D integrated circuits) include a plurality of vertically stacked semiconductor dice. In many instances, semiconductor dice, in a stacked semiconductor die package, are operably coupled together by through-silicon vias (TSVs). The process of forming TSVs in semiconductor die for assembly in a stacked semiconductor package increases the cost of the stacked semiconductor package. The process of forming TSVs in a stacked semiconductor package is incompatible with other cost-effective processes to form to the stacked semiconductor package. Additionally, utilizing TSVs decreases the "array efficiency" (i.e., the % of a memory array size which may be fabricated on an active surface of a die) of such semiconductor die.

BRIEF DESCRIPTION OF THE DRAWINGS

FIG. 6 is a flowchart illustrating an example method of forming a stacked memory device, in accordance with various embodiments of the present disclosure.

FIG. 7 is a flowchart illustrating an example method of transmitting signals between memory die via a substrate, in accordance with various embodiments of the present disclosure.

DETAILED DESCRIPTION

As described above, using through-silicon vias (TSVs), in stacked semiconductor die packages, undesirably increases the cost of the stacked semiconductor die packages. Moreover, using TSVs prohibits the use of alternative cost-effective processes (e.g., inline redistribution layers (iRDL)) and also decreases the array efficiency of the stacked dice.

In various embodiments described herein, a semiconductor package includes a number of vertically stacked semiconductor die. A first (bottom) semiconductor die (e.g., a master die) is coupled to a substrate via direct chip attachment (DCA) features and one or more other semiconductor die (e.g., slave die) are connected to the substrate via wire bonding. As a result, signals transmitted between the first semiconductor die and the one or more other semiconductor dice are transmitted via conductive paths of the substrate. Moreover, one or more of the semiconductor die (e.g., master and/or slave die) includes an iRDL to facilitate the transmission of signals between the semiconductor die.

Figure 1:
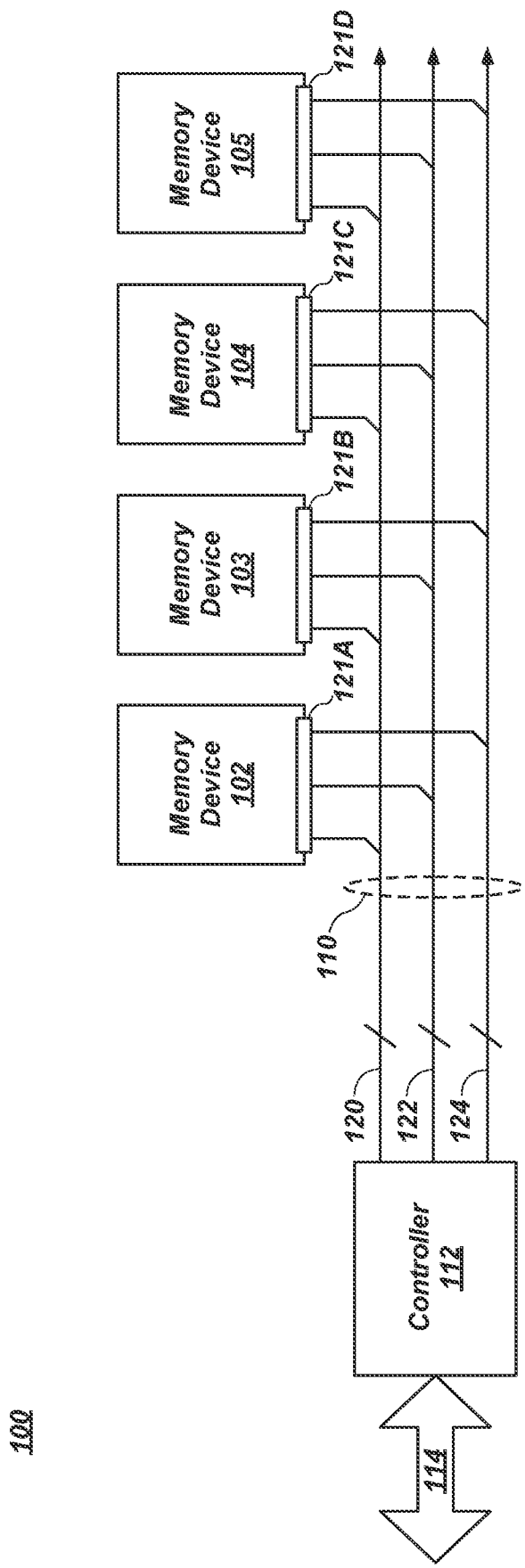
FIG. 1 is a block diagram of a memory system including a number of memory devices, in accordance with various embodiments of the present disclosure.

FIG. 1 illustrates a memory system 100, according to various embodiments of the present disclosure. Memory system 100 includes a number of memory devices 102, 103, 104 and 105 coupled to a communication bus 110 (e.g., a system bus). Each memory device 102-105 may include one or more memory die, and collectively, memory devices 102-105 may be referred to as a memory module (e.g., a dual in-line memory module (DIMM)), a multi-chip package (MCP) or a package on package (POP). In at least one embodiment, one or more of memory devices 102-105 are a stacked memory package that includes a master die and one or more slave die.

Memory system 100 further includes a controller 112 coupled to each memory device 102-105 via communication bus 110. Controller 112, which may include a processor or any other suitable type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB). In various embodiments, memory system 100 may include a DIMM and one or more memory devices 102-105 may be a rank (or a number of ranks) of the DIMM.

According to some embodiments of the present disclosure, at least some of memory devices 102-105 may be coupled to communication bus 110 via an associated interface 121A-121D (referred to collectively as interface 121). For example, interface 121 (any one of interface 121A-

121D) may include one or more nodes (e.g., input/output (I/O) nodes) for coupling signal lines of an associated memory device to respective signal lines of communication bus 110. Further, interface 121 may include one or more nodes coupled to one or more power supplies (not shown in FIG. 1), such as, for example, power and/or reference potentials. For example, each interface 121 may include an electromechanical type connection or soldered lead connection to communication bus 110.

A memory device (e.g., memory device 102) may be in an active mode in response to the memory device being selected to drive data bus 122 to a particular state, such as in response to performing a read operation in the memory device. Further, the memory device (e.g., memory device 102) may be in an inactive mode when another memory device (e.g., memory device 104) is selected to drive data bus 122 to a particular state, such as in response to performing a read operation in the other memory device (e.g., memory device 104).

Figure 2:
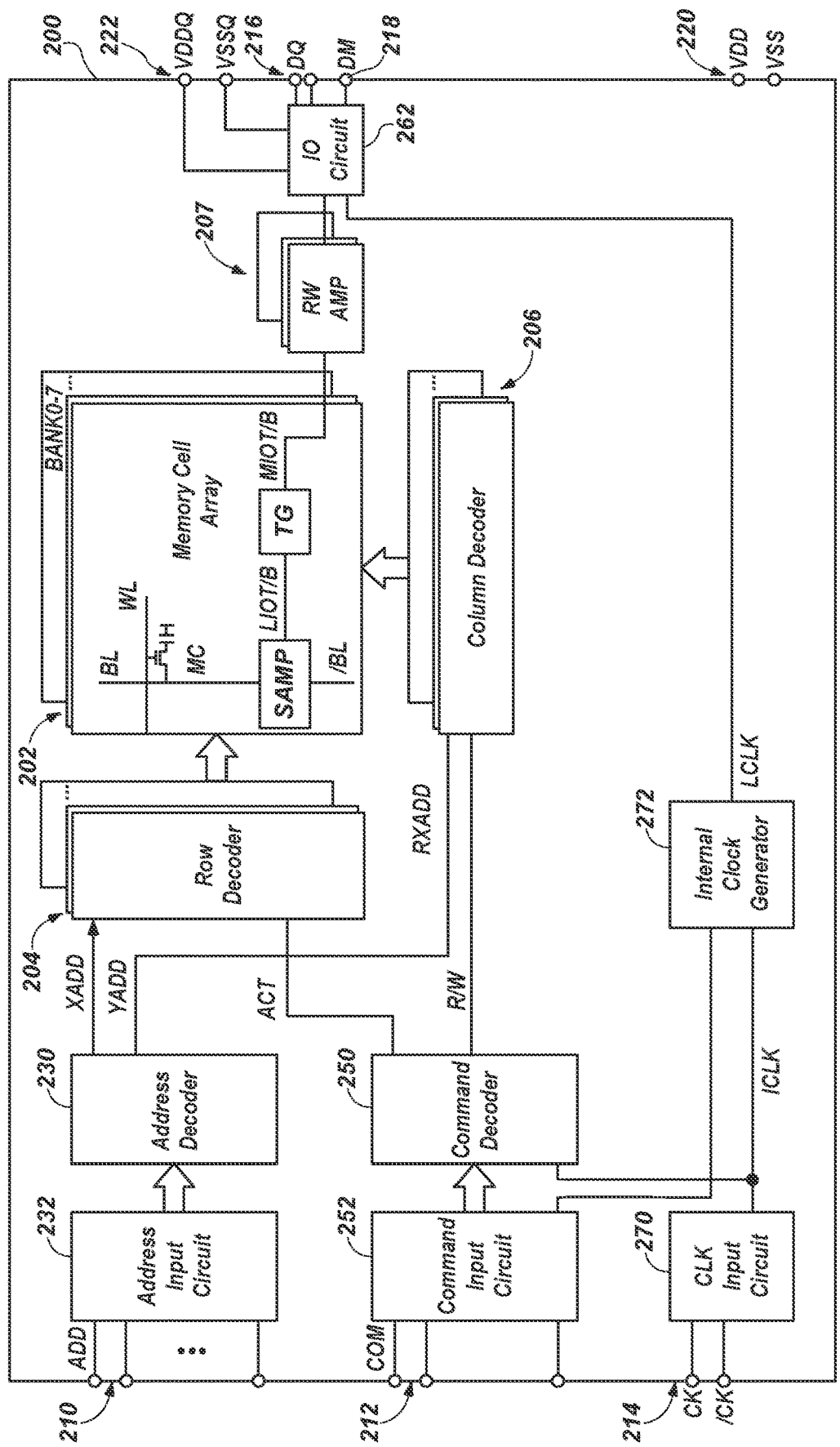
FIG. 2 is a block diagram of a memory device, according to various embodiments of the present disclosure.

FIG. 2 illustrates a memory device 200, according to various embodiments of the present disclosure. Memory device 200, which may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory), may be part of memory system 100 of FIG. 1. For example, memory device 200 may include one of memory devices 102-105 of FIG. 1. Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 204 and the selection of the bit lines BL and /BL may be performed by a column decoder 206. In the embodiment of FIG. 1, row decoder 204 may include a respective row decoder for each memory bank BANK0-7, and column decoder 206 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 207 over complementary local data lines (LIOT/B), transfer gate (TG), and complementary main data lines (MIOT/B). Conversely, write data outputted from read/write amplifiers 207 may be transferred to sense amplifier SAMP over complementary main data lines MIOT/B, transfer gate TG, and complementary local data lines LIOT/B, and written in memory cell MC coupled to bit line BL or/BL.

Memory device 200 may be generally configured to be receive various inputs (e.g., from an external controller) via various terminals, such as address terminals 210, command terminals 212, clock terminals 214, data terminals 216, and data mask terminals 218. Memory device 200 may include additional terminals such as power supply terminals 220 and 222.

During a contemplated operation, one or more command signals COM, received via command terminals 212, may be conveyed to a command decoder 250 via a command input circuit 252. Command decoder 250 may include a circuit configured to generate various internal commands via decoding one or more command signals COM. Examples of the internal commands include an active signal ACT and a read/write signal R/W.

Further, one or more address signals ADD, received via address terminals 210, may be conveyed to an address decoder 230 via an address input circuit 232. Address decoder 230 may be configured to supply a row address XADD to row decoder 204 and a column address YADD to column decoder 206.

Active signal ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 206 may be activated, and the bit line BL specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifier 207, an input/output circuit 262, and data terminal 216. Further, in response to active signal ACT, a write signal, a row address XADD, and a column address YADD, write data may be supplied to memory array 202 via data terminal 216, input/output circuit 262, read/write amplifier 207, transfer gate TG, and sense amplifier SAMP. The write data may be written to memory cell MC specified by row address XADD and column address YADD.

Clock signals CK and/CK may be received via clock terminals 214. A clock input circuit 270 may generate internal clock signals ICLK based on clock signals CK and ICK. Internal clock signals ICLK may be conveyed to various components of memory device 200, such as command decoder 250 and an internal clock generator 272. Internal clock generator 272 may generate internal clock signals LCLK, which may be conveyed to input/output circuit 262 (e.g., for controlling the operation timing of input/output circuit 262). Further, data mask terminals 218 may receive one or more data mask signals DM. When data mask signal DM is activated, overwrite of corresponding data may be prohibited.

Figure 3A:
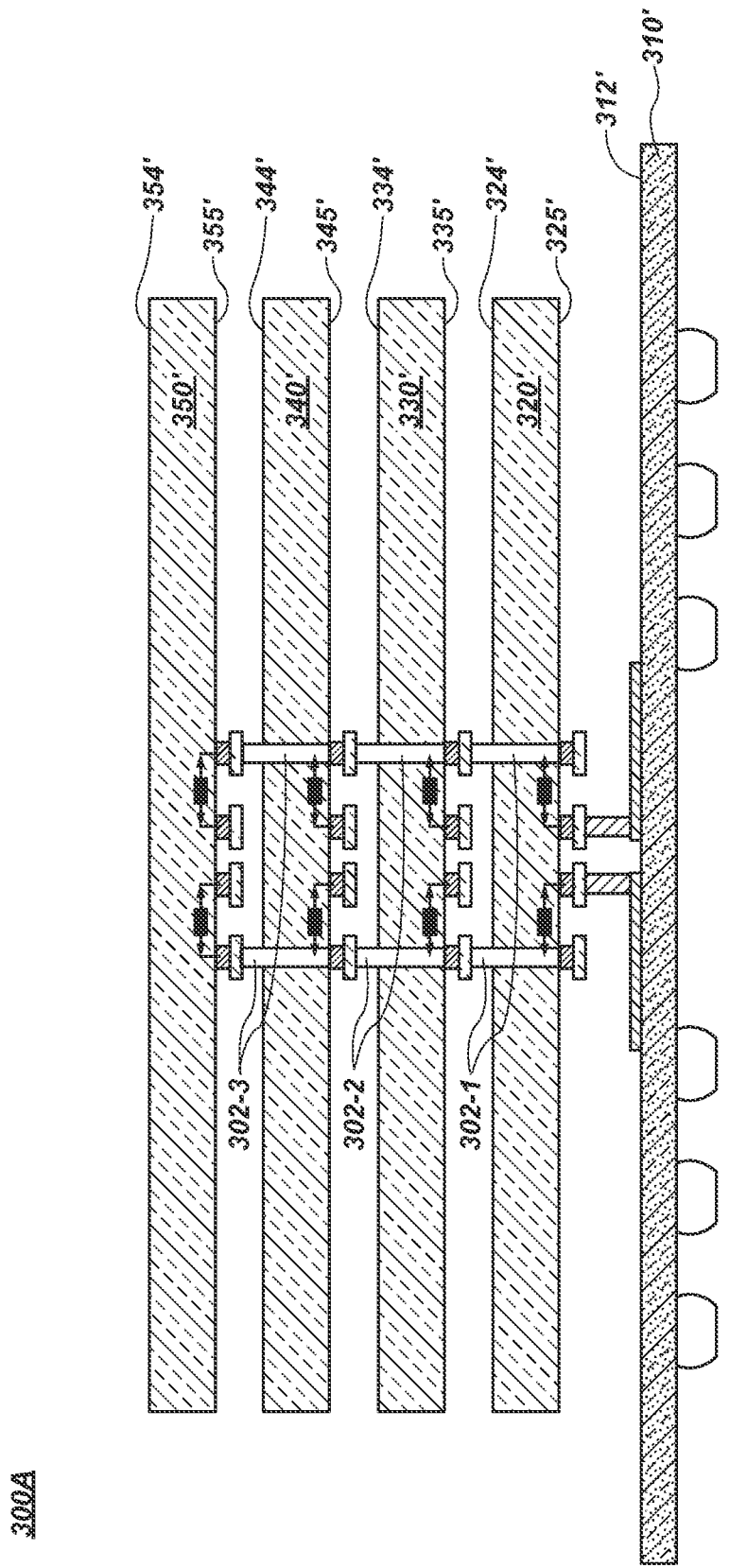
FIG. 3A is a block diagram of a stacked die package using conventional TSV interconnect.

FIG. 3A is a diagram of a conventional stacked die package 300A. Stacked die package 300A comprises a plurality of vertically stacked die. The term "die" provided herein may refer to a single die or may refer to a plurality of die (e.g., dice or dies). Stacked die package 300A includes semiconductor die 320' (also referred to as a "bottom die" in stacked die package 300A), semiconductor die 330', semiconductor die 340' and semiconductor die 350' (also referred to as a "top die" in stacked die package 300A).

Each of the semiconductor die are oriented in same direction (e.g., in a "face down" direction, with active surfaces facing downwardly toward substrate 310'). For example, back side surface 324' of die 320', back side surface 334' of die 330', back side surface 344' of die 340' and back side surface 354' of die 350' each face the same vertical direction. More specifically, upper surface 312' of substrate 310' faces active surface 325' of die 320', active surface 335' of die 330' faces back side surface 324' of die 320', active surface 345' of die 340' faces back side surface 334' of die 330' and active surface 355' of die 350' faces back side surface 344' of the 340'.

Each of the semiconductor die is mutually operably coupled by TSVs. A TSV is a vertical electrical connection (e.g., via) that is dielectrically isolated from, and passes completely through, a silicon wafer or die. In stacked die package 300A, semiconductor die 320' is operably coupled to semiconductor die 330' via TSVs 302-1. Semiconductor die 330' is operably coupled to semiconductor die 340' via TSVs 302-2. Semiconductor die 340' is operably coupled to semiconductor die 350' via TSVs 302-3. Accordingly, signals transmitted to stacked die package 300A (from external circuitry) are received through substrate 310' and transmitted to one or more die via respective TSVs. Similarly, signals transmitted from stacked die package 300A are transmitted from one or more die via respective TSVs and through substrate 310' (to external circuitry).

Figure 3B:
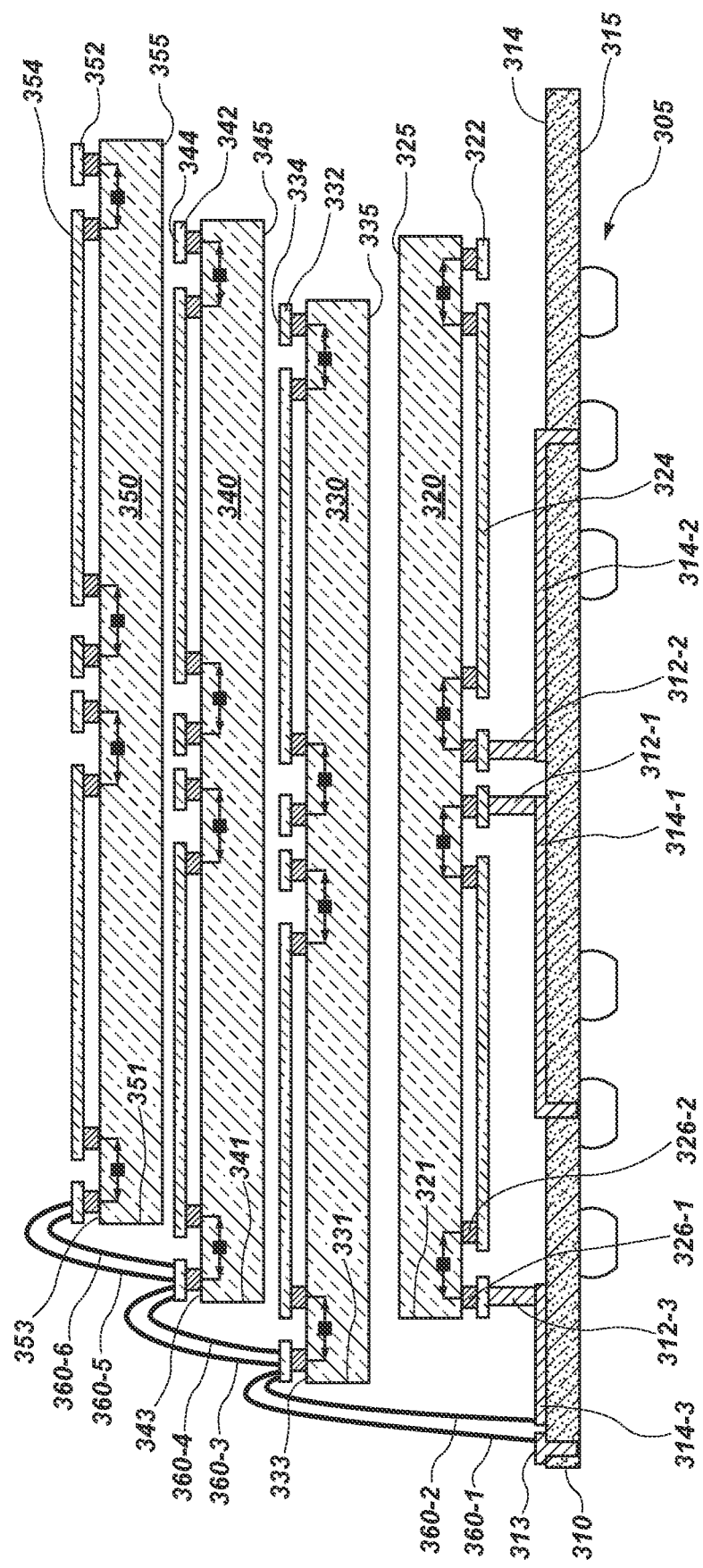
FIG. 3B is a block diagram of a stacked die package using DCA features and wire bonding as interconnects, in accordance with various embodiments of the present disclosure.

FIG. 3B is a diagram of a stacked die package 300B, according to various embodiments of the present disclosure. Stacked die package 300B comprises a plurality of vertically stacked semiconductor die. For example, stacked die package 300B includes semiconductor die 320, semiconductor die 330, semiconductor die 340 and semiconductor die 350 that are vertically stacked with respect to one another. For example, the semiconductor die may include DRAM die. Stacked die package 300B may comprise a DDR4 SDRAM device. The stacking of die in stacked die package 300B may be referred to as a three-dimensional stacking (or "3DS"), where the vertical direction (of the stacked die) is along a Z-axis, and the length and width of the respective die are along an X-axis and a Y-axis, respectively.

One or more of die 320-350 may be a same type of die (e.g., DRAM die) or may be different types of die, for example, bottom die 320 may be a logic die. One or more of die 320-350 may have the same dimensions (e.g., same height, width, length) or may have different dimensions. Stacked die package 300B, as depicted, includes four stacked semiconductor die. However, stacked die package 300B may include more or less than four stacked semiconductor die.

Stacked die package 300B, in various embodiments, employs a master/slave relationship between the stacked die. That is, one die is configured as a master die (e.g., die 320) and the remaining die (e.g., die 330, 340 and 350) in the stack are configured as slave device(s). Each die may function as a different logical rank. In various embodiments, the master die is the only die that interfaces with external circuitry such as a memory controller. Additionally, because the master die provides isolation (or buffering) to the slave die, the electrical signal loading of the external interface is that of a single die (e.g., a single DDR4 SDRAM), which can improve timing, bus speeds, and/or signal integrity while lowering power consumption.

Stacked die package 300B includes substrate 310 that supports the vertically stacked die. Substrate 310 comprises interconnects 305 coupled to back side surface 315 of substrate 310. Interconnects 305 may comprise solder balls, or any other structure suitable for electrically coupling stacked die package 300B with circuitry external of the package (e.g., memory controller circuitry).

Substrate 310 includes interconnects 314-1, interconnects 314-2 and interconnects 314-3. Such interconnects can be, but are not limited to, traces and/or vias. Interconnects 314-1 and 314-2 are electrically coupled to interconnects 305. Interconnects 314-1 and 314-2 are coupled to direct chip attachment (DCA) features (also referred to as DCA interconnects) 312-1 and 312-2, respectively. As a result, die 320 is coupled to interconnects 314-1 and 314-2 of substrate 310 via DCA features 312-1 and 312-2, respectively. The term "DCA" refers to directly attaching an integrated circuit (chip or die) to a component such as a substrate or printed circuit board. DCA eliminates the cost of separately packaging the integrated circuit into a carrier before attaching the carrier to another component. DCA features 312-1, 312-2, and 312-3, in various embodiments, may include DCA pillars, such as copper pillars, which may (for example) extend between a die and terminal pads of a substrate.

Interconnects 314-3 of substrate 310 are electrically coupled to DCA features 312-3 (also referred to as DCA interconnects). As a result, die 320 is coupled to interconnects 314-3 of substrate 310 via DCA features 312-3. Moreover, as will be described in further detail below, die 320 is electrically coupled to die 330, 340, and 350 via interconnects 314-3 and DCA features 312-3.

It should be appreciated that DCA features 312-1, 312-2, and 312-3, in various embodiments, may be configured as respective rows of DCA features perpendicular to the plane of the drawing sheet. As such, a first DCA feature of respective rows of DCA features 312-1, 312-2 and 312-3 are depicted in FIG. 3B and the other DCA features in the respective rows of DCA features are not shown. In various embodiments, DCA features 312-1 include a row of, for example, 70 DCA pillars (along a center portion of active surface 324 of die 320 and upper surface 314 of substrate 310) and DCA features 312-2 include a row of, for example, 70 DCA pillars (along a center portion of active surface 324 of die 320 and upper surface 314 of substrate 310).

In various embodiments, one or more of die 320-350 may include an inline redistribution layer (iRDL). For example, die 320 includes iRDL 322, die 330 includes iRDL 332, die 340 includes iRDL 342 and die 350 includes iRDL 352.

An iRDL, in various embodiments, is a redistribution layer that may be the lowest resistivity layer in the die. Additionally, an iRDL includes low resistivity lines that provide power to certain locations within the device (or die). The iRDL may be formed in a semiconductor fabrication process that occurs before semiconductor die are assembled in a stack. In some cases, an iRDL layer may include a metal 4 (M4) layer over a metal 3 (M3) layer. For power to be transferred from the iRDL layer to lower layers of a die, the die may include one or more vias. A die may include one or more "iRDL vias" that provide conductive pathways between power distribution lines in the iRDL layer ("iRDL lines") to wiring that is located in an underlying metal layer. In one example, an iRDL (e.g., iRDL 322) includes vias (e.g., vias 326-2 and 326-1) that provide a conductive pathway between an M4 layer and an M3 layer. The die may also include additional vias that provide conductive pathways between other layers, such as M3-M2 vias.

An iRDL layer may be an uppermost layer of a die, over the active surface. For example, a top of active surface 324 of die 320 is an outermost surface of iRDL 322. Similarly, a top of active surface 334 of die 330 is an outermost surface of iRDL 332, a top of active surface 344 of die 340 is an outermost surface of iRDL 342 and a top of active surface 354 of die 350 is an outermost surface of iRDL 352.

In some embodiments, die 320 is "face down" with respect to substrate 310. That is, active surface 324 of die 320 faces upper surface 314 of substrate 310. However, die 330, 340 and 350 are positioned in an opposite orientation than die 320. That is, die 330, 340 and 350 are positioned "face up" with respect to substrate 310, with their active surfaces 334, 344 and 354 facing away from substrate 310.

For example, back side surface 335 of die 330 faces back side surface 325 of die 320, back side surface 345 of die 340 faces active surface 334 of die 330 and back side surface 355 of die 350 faces active surface 344 of die 340.

Die 330, 340 and 350 are electrically coupled to substrate 310 via wire bonding, a conventional interconnection technique used for electrically connecting microelectronic devices (e.g., semiconductor dice) to the terminals of a chip package or directly to a terminal on a substrate.

Die 330 is electrically coupled to interconnects 314-3 (e.g., traces) of substrate 310 via two sets (or rows) of wires, such as wires 360-1 and wires 360-2. In at least one embodiment, wires 360-1 may include a first row of, for example, 100 wires and wires 360-2 may include a second row of, for example, 100 wires, the rows of wires being perpendicular to the plane of the drawing sheet. Wires 360-1 and wires 360-2 are bonded proximate to (1) lateral end 313 of upper surface 314 of substrate 310 at rows of wire bond features 460 and 462 (see FIG. 4) and (2) lateral end 333 of active surface 334 of die 330.

Die 340 is electrically coupled to die 330 via two sets (or rows) of wires, such as wires 360-4 and 360-3. In at least one embodiment, wires 360-3 may include a first row of, for example, 100 wires and wires 360-4 may include a second row of, for example, 100 wires. Wires 360-3 and wires 360-4 are bonded proximate to (1) lateral end 333 of active surface 334 of die 330 and (2) lateral end 343 of active surface 344 of die 340. Die 340 is electrically coupled to substrate 310 via wires 360-4/360-3 and wires 360-2/360-1.

Die 350 is electrically coupled to die 340 via two sets (or rows) of wires, such as wires 360-5 and 360-6. In one embodiment, wires 360-5 are a first row of 100 wires and wires 360-5 are a second row of 100 wires. Wires 360-5 and wires 360-6 are bonded proximate to (1) lateral end 343 of active surface 344 of die 340 and (2) lateral end 353 of active surface 354 of die 350. Die 350 is electrically coupled to substrate 310 via wires 360-6/36-5, wires 360-4/360-3 and wires 360-2/360-1.

In some embodiments, die 320, 330, 340 and 350 are laterally offset from one another. For example, lateral side 331 of die 330 is laterally offset from lateral side 321 of die in a first lateral direction. Lateral side 341 of die 340 is laterally offset from lateral side 331 of die 330 in an opposite second lateral direction. Lateral side 351 of die 350 is laterally offset from lateral side 341 in the second direction. The laterally offset lateral sides of die 320, and the "shingle stack" offset arrangement of die 330, 340 and 350 provides for, among other things, an area for wire bonding to pads on respective active surfaces of die 330, 340 and 350.

Die 330, 340 and 350 (that are electrically coupled to one another and to substrate 310 via wire bonding) are electrically coupled to die 320 via interconnect 314-3 of substrate 310 and DCA features 312-3. As such, internal signals (e.g., power signals, read/write signals, etc.) transmitted between die 320 and any one of die 330, 340 and 350 are transmitted via substrate 310 (i.e., via interconnects 314-3 of substrate 310). The term "via substrate" as provided herein refers to signals transmitted between die 320 and any one of die 330, 340 and 350 are transmitted along a conductive path of substrate 310. One example of a conductive path is interconnects 314-3 (e.g., traces and/or vias).

More specifically, external signals (e.g., command signals, address signals, data signals, power signals and the like) are received at die 320 (from external circuitry) via DCA features 312-1 and 312-2. The external signals are decoded into internal signals via one or more decoders (e.g., address decoder 230, FIG. 2). In at least one embodiment, external signals received by die 320 include, for example, 52 signals and 90 power signals that are decoded into, for example, 128 internal signals and 68 internal power signals (that are subsequently transmitted to one or more of die 330-350).

The internal signals are transmitted along iRDL 322 of die 320 to interconnects 314-3 of substrate 310 via DCA features 312-3. The internal signals are then transmitted to one or more slave die 330, 340 and 350 via respective wire bonding between the slave die and substrate 310. Likewise, internal signals transmitted to die 320 from one or more die 330, 340 and 350 are transmitted via respective wire bonding to interconnect 314-3 of substrate 310. The internal signals are then transmitted along iRDL 322 of die 320 to interconnects of substrate 310 via one or more DCA features 312-1 and 312-2. The signals are then transmitted to external circuitry from the interconnects of substrate via interconnects 305.

Additionally, stacked die package 300B, as described herein, eliminates the use of TSVs. As such, stacked die package 300B implements various features such as iRDL on the stacked dies and DCA features and wire bonding to interconnect the stacked dies and substrate. By eliminating TSVs, the array efficiency of the stacked dies increases (e.g., ~2.35% increase) with respect to stacked die package 300A, the chip/die size is decreased (e.g., ~4.7% decrease) with respect to stacked die package 300A, and power consumption is reduced (e.g., ~12% reduction) with respect to stacked die package 300A.

Figure 4:
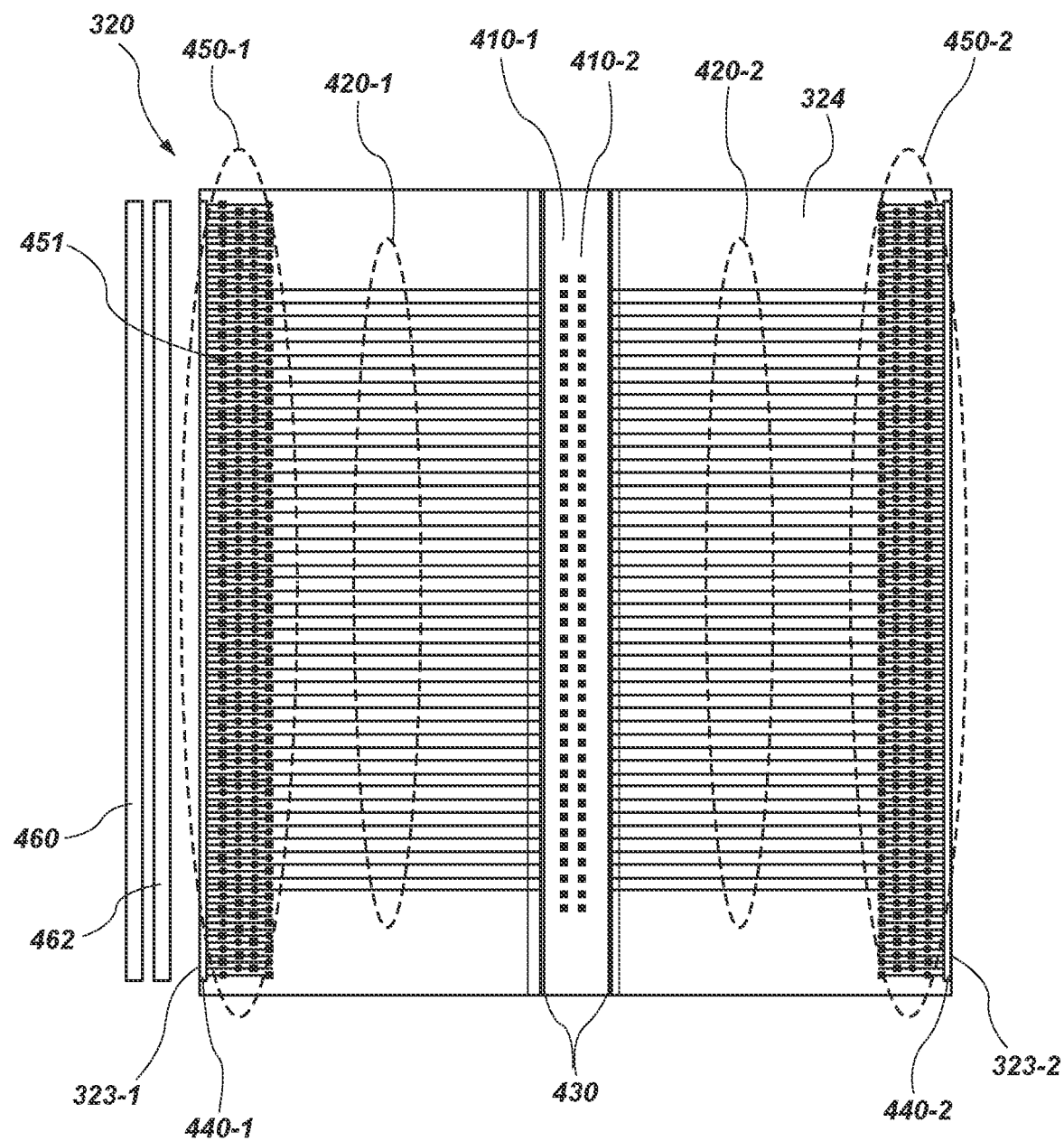
FIG. 4 is a view of a top surface of a master die in a stacked die package, in accordance with various embodiments of the present disclosure.

FIG. 4 is a diagram of a semiconductor die 400 used in stacked die package 300B. In particular, FIG. 4 depicts a view of active surface 324 of die 320 (e.g., master die) and slave die 330, 340 and 350. Die 320, 330, 340 and 350 each include two rows of DCA pads proximate a center portion of active surface 324, but only die 320 utilizes a row of DCA pads 410-1 (e.g., 70 DCA pads) configured to electrically couple to DCA features 312-1 (see FIG. 3B) and row of DCA pads 410-2 (e.g., 70 DCA pads) configured to electrically couple to DCA features 312-2 (see FIG. 3B) of substrate 310 with conductive pillars.

Die 320, 330, 340 and 350 includes iRDL power lines 420-1 and iRDL power lines 420-2 of iRDL 322, 332, 342 and 352, respectively. In at least one embodiment, iRDL power lines 420-1 comprises, for example, 70 iRDL power lines and iRDL power lines 420-2 comprises, for example, 70 iRDL power lines. The same iRDL arrangement pertains to die 330, 340 and 350.

Die 320 also includes center driver 430 disposed along DCA pads 410-1 and DCA pads 410-2. Die 320 also includes edge repeater 440-1 (along lateral edge 323-1) and edge repeater 440-2 (along lateral edge 323-2). The same iRDL arrangement pertains to die 330, 340 and 350.

Die 320, 330, 340 and 350 each further include a group of electrical connection pads 450-1 and electrical connection pads 450-2. Electrical connection pads 450-1 and 450-2 each include a number of pads configured to connect to various interconnects for signals and power. For example, electrical connection pads 450-1 and 450-2, in an embodiment, each include four separate rows of pads, where each row includes 100 pads. In various embodiments, at least a portion of the square-shaped pads 451 (e.g., 132 DCA pads) are configured for connection of die 320 with DCA features (e.g., DCA features 312-3) of substrate 310.

FIG. 4 also schematically depicts two rows of wire bond pads (fingers) for wire bonding as described herein. For example, wire bond features 460 (e.g., 100 wire bond pads) and wire bond features 462 (e.g., 100 wire bond pads) are disposed on upper surface 314 of substrate 310. In one embodiment, wires 360-1 (see FIG. 3B) are coupled to wire bond features 460 and wires 360-2 (see FIG. 3B) are coupled to wire bond features 462.

Figure 5:
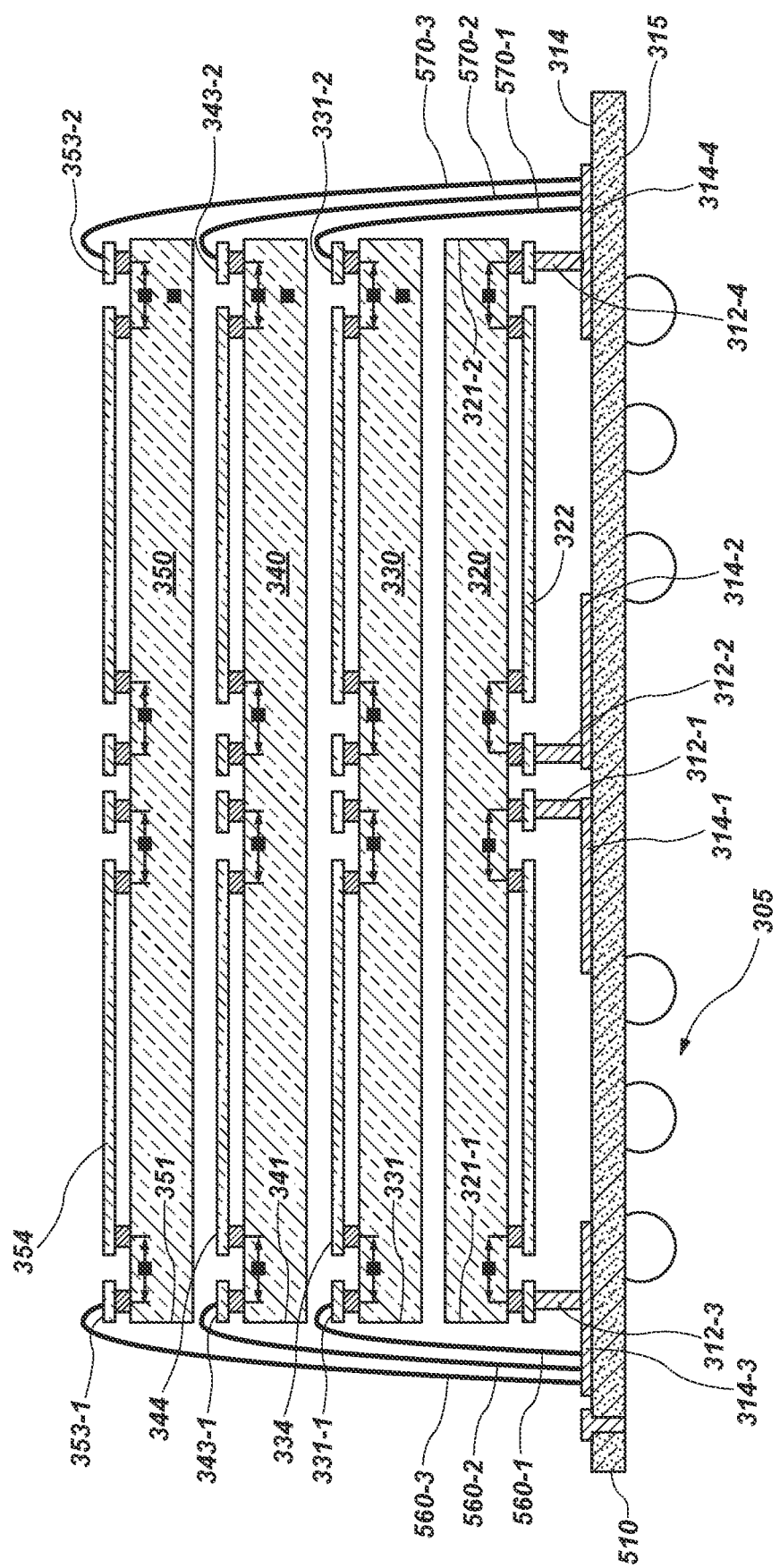
FIG. 5 is a block diagram of a stacked die package using DCA features and wire bonding as interconnects, in accordance with various embodiments of the present disclosure.

FIG. 5 is a diagram of a stacked die package 500. Stacked die package 500 is similar to stacked die package 300B. As such, stacked die package 500 includes many features and functionalities the same and/or similar to stacked die package 300B. However, stacked die package 500 includes various differences with respect to stacked die package 300B. For example, stacked die package 500 includes wire bonding on opposite lateral sides of the stacked die. For clarity and brevity, description of stacked die package 500 is directed to the various differences between stacked die package 500 and stacked die package 300B.

Substrate 510 includes interconnects 314-1, interconnects 314-2, interconnects 314-3 and interconnects 314-4. Interconnects 314-1 and 314-2 are electrically coupled to interconnects 305. Interconnects 314-1 and 314-2 are coupled to direct chip attachment (DCA) features (also referred to as DCA interconnects) 312-1 and 312-2, respectively. As a result, die 320 is coupled to interconnects 314-1 and 314-2 of substrate 310 via the DCA features 312-1 and 312-2.

Interconnects 314-3 are electrically coupled to DCA features 312-3 that are proximate first lateral side 321-1 of die 320. As a result, die 320 is coupled to interconnects 314-3 of substrate 310 via DCA features 312-3. Additionally, interconnects 314-4 are electrically coupled to DCA features 312-4 that are proximate a second lateral side 321-2 of die 320. As a result, die 320 is coupled to interconnects 314-4 of substrate 310 via DCA features 312-4.

Die 330, 340 and 350 are electrically coupled to substrate 310 via wire bonding. Die 330 is electrically coupled to substrate 310 via wires 560-1 and 570-1. Wires 560-1 are bonded between interconnects 314-3 and active surface 334 of die 330 (proximate first lateral end 331-1 of active surface 334). Wires 570-1 are bonded between interconnects 314-4 of substrate 310 and active surface 334 of die 330 (proximate second lateral end 331-2 of active surface 334). In one embodiment, wires 560-1 comprise a row of, for example, 118 wires and wires 570-1 comprise a row of, for example, 118 wires, perpendicular to the plane of the drawing sheet.

Die 340 is electrically coupled to substrate 310 via wires 560-2 and 570-2. Wires 560-2 are bonded between interconnects 314-3 and active surface 344 of die 340 (proximate first lateral end 343-1 of active surface 344). Wires 570-2 are bonded between interconnects 314-4 of substrate 310 and active surface 344 of die 330 (proximate second lateral end 343-2 of active surface 344). In one embodiment, wires 560-2 comprise a row of, for example, 118 wires and wires 570-2 comprise a row of, for example, 118 wires, perpendicular to the plane of the drawing sheet.

Die 350 is electrically coupled to substrate 310 via wires 560-3 and 570-3. Wires 560-3 are bonded between interconnects 314-3 and active surface 354 of die 350 (proximate first lateral end 353-1 of active surface 354). Wires 570-3 are bonded between interconnects 314-4 of substrate 310 and active surface 354 of die 330 (proximate second lateral end 353-2 of active surface 344). In one embodiment, wires 560-3 comprise a row of, for example, 118 wires and wires 570-3 comprise a row of, for example, 118 wires, perpendicular to the plane of the drawing sheet.

In some embodiments, die 320, 330, 340 and 350 are substantially laterally aligned with one another, i.e., completely vertically superimposed. For example, lateral side 321-1 of die 320 is substantially laterally aligned with lateral side 331 of die 330. Lateral side 331 of die 330 is substantially laterally aligned with lateral side 341 of die 340. Lateral side 341 of die 340 is substantially laterally aligned with lateral side 351 of die 350.

Die 330, 340 and 350 (that are electrically coupled to substrate 310 via wire bonding) are electrically coupled to die 320 via (1) interconnect 314-3 of substrate 310 and DCA features 312-3 and (2) interconnects 314-4 of substrate 310 and DCA features 312-4. As such, signals (e.g., decoded internal signals) transmitted between die 320 and any one of die 330, 340 and 350 are transmitted via substrate 310 (i.e., via interconnects 314-3 and/or interconnects 314-4 of substrate 310).

More specifically, signals (e.g., external signals) are received at die 320 (from external circuitry) via DCA features 312-1 and 312-2. In one embodiment, external signals received by die 320 includes, for example, 52 signals and 90 power signals that are decoded into, for example, 91 internal signals and 27 internal power signals. The signals are then transmitted along iRDL 322 of die 320 to one or more of (1) interconnects 314-3 of substrate 310 via DCA features 312-3 and (2) interconnects 314-4 of substrate 310 via DCA features 312-4. The signals are then transmitted to one or more die (e.g., slave die) via respective wire bonding between the die and substrate 310. Likewise, signals transmitted to die 320 from one or more die 330, 340 and 350 are transmitted along respective wire bonding to one or more of (1) interconnect 314-3 of substrate 310 and (2) interconnect 314-3 of substrate 310. The signals are then transmitted along iRDL 322 of die 320 to interconnects 314-1 and/or 314-2 of substrate 310 via one or more DCA features 312-1 and 312-2. The signals are then transmitted to external circuitry from interconnects of substrate via interconnects 305.

FIG. 6 is a flowchart of an example method 600 of forming a stacked memory device. Method 600 may be arranged in accordance with at least one embodiment described in the present disclosure. Method 600 may be implemented, in some embodiments, in the context of a device or system, such as memory system 100 of FIG. 1, memory device 200 of FIG. 2B, stacked die package 300B of FIG. 3B, stacked die package 500 of FIG. 5 or another device or system. Although illustrated as discrete blocks, various blocks may be divided into additional blocks, combined into fewer blocks, or eliminated, depending on the desired implementation.

At block 610, a first integrated circuit die is disposed over a substrate with an active surface of the first integrated circuit die facing an upper surface of the substrate. For example, referring to FIG. 3B, die 320 (e.g., a master die) is disposed face down over substrate 310. In particular, iRDL 322 of die 320 faces upper surface 314 of substrate 310.

At block 620, the first integrated circuit die is electrically coupled to the substrate via direct chip attachment (DCA) features. For example, die 320 is electrically coupled to substrate 310 via DCA features 312-1, 312-2 and 312-3.

At block 630, a second integrated circuit die is disposed over the first integrated circuit die with a back side surface of the second integrated circuit die facing a back side surface of the first integrated circuit die. For example, die 330 is disposed over die 320. In particular, die 330 is disposed active surface face up (while die 320 is disposed active surface face down).

At block 640, the second integrated circuit die is electrically coupled to the substrate via first wire bonds. For example, die 330 is electrically coupled to substrate 310 via wires 360-1 and wires 360-2.

The foregoing process may be repeated with additional die oriented in the same direction as die 330.

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

FIG. 7 is a flowchart of an example method 700 of transmitting signals between memory dies via the substrate. Method 700 may be arranged in accordance with at least one embodiment described in the present disclosure. Method 700 may be performed, in some embodiments, in the context of a device or system, such as memory system 100 of FIG. 1, memory device 200 of FIG. 2B, stacked die package 300B of FIG. 3B, stacked die package 500 of FIG. 5 or another device or system. Although illustrated as discrete blocks, various blocks may be divided into additional blocks, combined into fewer blocks, or eliminated, depending on the desired implementation.

At block 710, read or write signals are received at a first memory die of a stacked die package from a substrate of the stacked die package, wherein an active surface of the first memory die faces an upper surface of the substrate. For example, referring to FIG. 3B, signals (e.g., read/write signals) are received by semiconductor die 320 from external circuitry (e.g., a memory controller) via substrate 310.

At block 720, the read or write signals are transmitted from the first memory die to a second memory die of the stacked die package via the substrate, wherein the second memory die is located over the first memory die. For example, the signals are transmitted from die 320 to one or more of die 330-350 via substrate 310. Specifically, the signals are transmitted via DCA features 312-3 and interconnects 314-3 to the one or more die 330-350.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

A semiconductor device is also disclosed. The semiconductor device, which may include a memory device, may include one or more arrays (e.g., memory arrays). The semiconductor device may also include an output device including one or more output driver circuits, as described herein.

Figure 8:
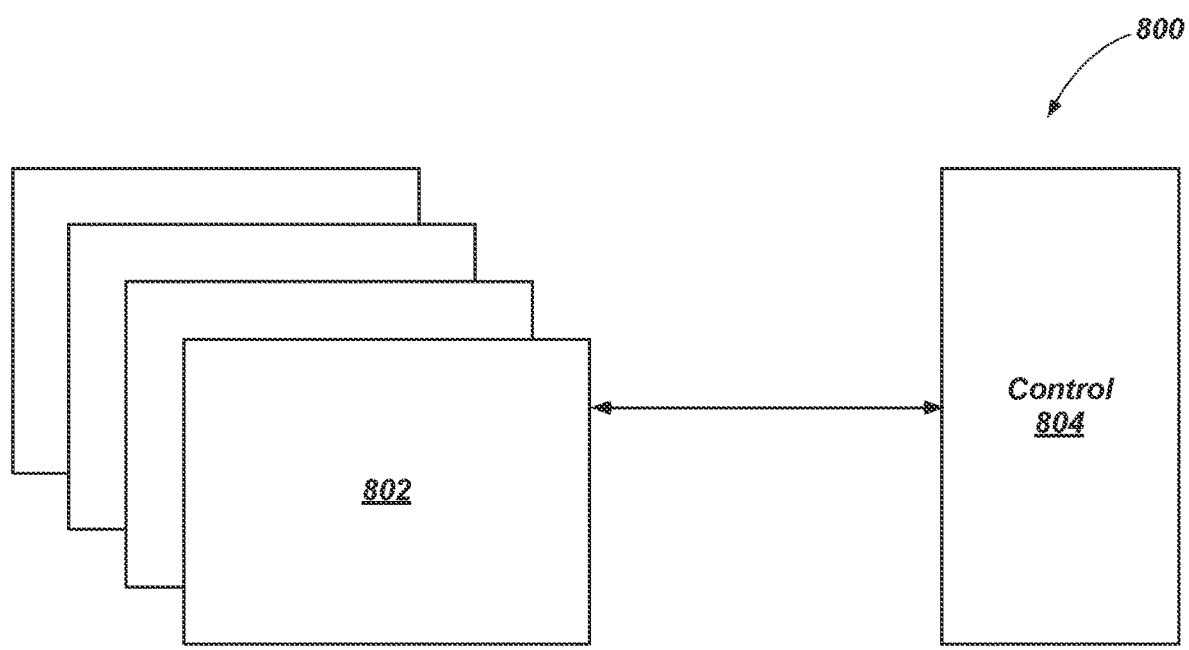
FIG. 8 is a simplified block diagram of a semiconductor device, in accordance with various embodiments of the present disclosure.

FIG. 8 is a simplified block diagram of a memory system 800 implemented according to one or more embodiments described herein. Memory system 800 includes a memory module including a number of memory devices 802 and a control logic component 804. For example, memory devices 802 may include memory devices 102-105 of FIG. 1, configured as stacked die package 300B or stacked die package 500 and control logic component 804 may include controller 112 of FIG. 1. Control logic component 804 may be operatively coupled with the memory devices 802 so as to read, write, or re-fresh any or all memory cells within memory devices 802.

Figure 9:
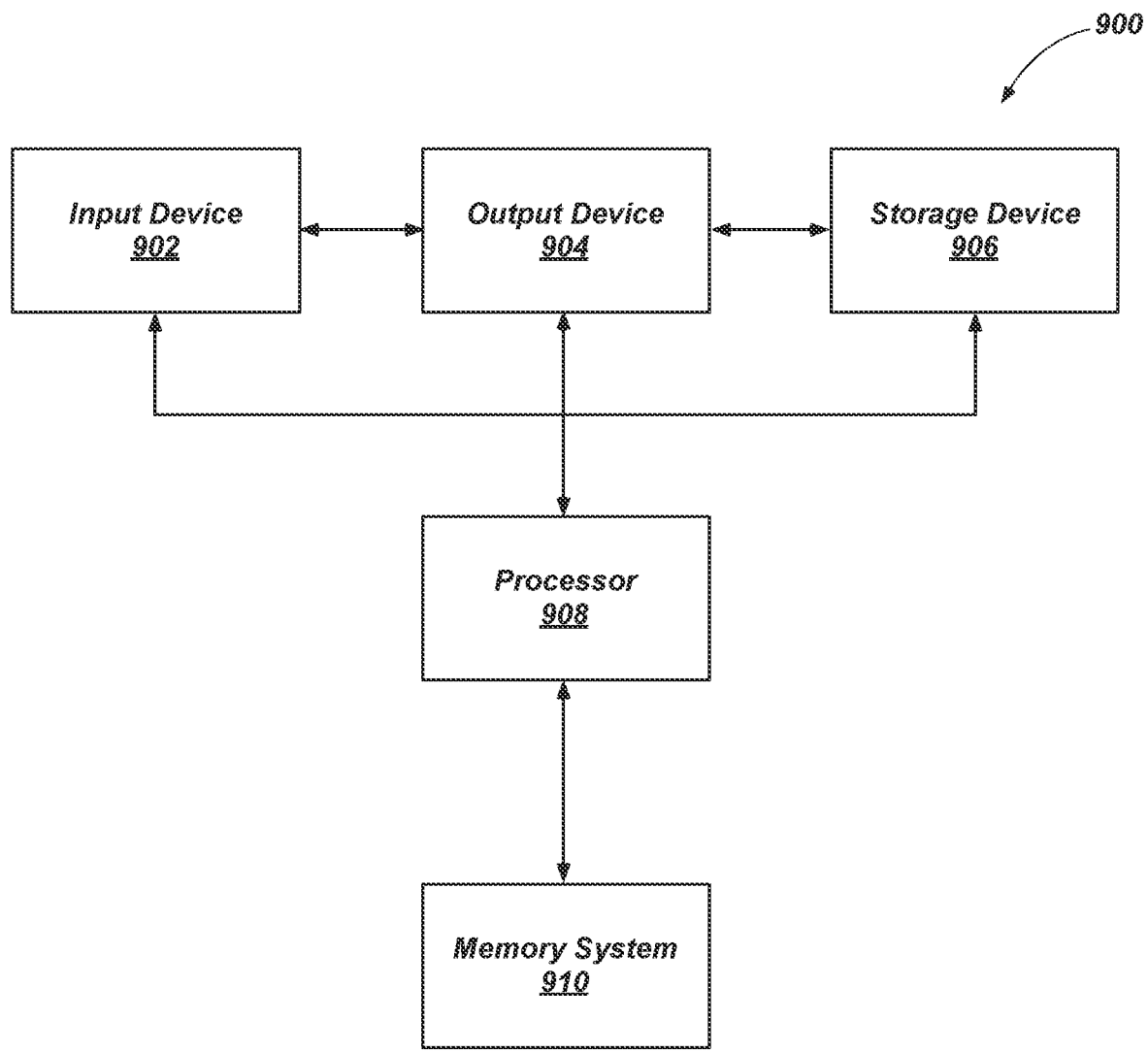
FIG. 9 is a simplified block diagram of an electronic system, in accordance with various embodiments of the present disclosure.

An electronic system is also disclosed. The electronic system may include memory system including a number of memory devices. FIG. 9 is a simplified block diagram of an electronic system 900 implemented according to one or more embodiments described herein. Electronic system 900 includes at least one input device 902. Input device 902 may be a keyboard, a mouse, or a touch screen. Electronic system 900 further includes at least one output device 904. Output device 904 may be a monitor, touch screen, or speaker. Input device 902 and output device 904 are not necessarily separable from one another. Electronic system 900 further includes a storage device 906. Input device 902, output device 904, and storage device 906 are coupled to a processor 908.

Electronic system 900 further includes a memory system 910 coupled to processor 908. Memory system 910, which may include memory system 100 of FIG. 1 including memory devices (e.g., memory device 102-105 of FIG. 1) implemented in the form of stacked die package 300B or stacked die package 500. Electronic system 900 may include a computing, processing, industrial, or consumer product. For example, without limitation, electronic system 900 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

One or more embodiments of the present disclosure include an apparatus. The apparatus includes a substrate, a first semiconductor die disposed proximate the substrate with an active surface facing an upper surface of the substrate and communicatively coupled to the substrate by direct chip attachment (DCA) features, and at least a second semiconductor die disposed over the first semiconductor die with a back side surface facing a back side surface of the first semiconductor die. The at least the second semiconductor die is communicatively coupled to the substrate by first wire bonds.

One or more embodiments of the present disclosure include a method of forming a stacked memory device. The method comprising disposing a first integrated circuit die over a substrate with an active surface of the first integrated circuit die facing an upper surface of the substrate, electrically coupling the first integrated circuit die to the substrate via direct chip attachment (DCA) features, disposing a second integrated circuit die over the first integrated circuit die with a back side surface of the second integrated circuit die facing a back side surface of the first integrated circuit die, and electrically coupling the second integrated circuit die to the substrate via first wire bonds.

One or more embodiments of the present disclosure include a stacked die package. The stacked includes a substrate, a first memory die over the substrate having an active surface comprising an in-line redistribution layer (iRDL) facing an upper surface of the substrate, wherein the first memory die is communicatively coupled to the substrate via direct chip attachment (DCA) features, and a second memory die over the first memory die with an active surface facing away from the first memory die, wherein the second memory die is communicatively coupled to the substrate via first wire bonds.

One or more embodiments of the present disclosure include a method comprising receiving a read or write signals at a first memory die of a stacked die package from a substrate of the stacked die package, wherein an active surface of the first memory die faces an upper surface of the substrate, and transmitting the read or write signals from the first memory die to a second memory die of the stacked die package via the substrate, wherein the second memory die is located over the first memory die.

One or more embodiments of the present disclosure include an electronic system. The electronic system comprising at least one input device, at least one output device, at least one processor device operably coupled to the input device and the output device, and at least one memory device operably coupled to the at least one processor device. The memory device comprising a substrate bearing a first memory die having a downward-facing active surface, the first memory die and the substrate operably coupled by direct chip attachment (DCA) features, and a second memory die located above the first memory die and operably coupled to the substrate by wire bonds.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., body of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method, comprising:
receiving read or write signals at a first memory die of a stacked die package from a substrate of the stacked die package, wherein an active surface of the first memory die faces an upper surface of the substrate; and
transmitting the read or write signals from the first memory die to an interconnect on the upper surface of the substrate via at least one direct chip attachment feature between the interconnect and the active surface of the first memory die; and
transmitting the read or write signals from the interconnect to a second memory die of the stacked die package via at least one wire bond between an active surface of the second memory die and the interconnect, wherein the second memory die is located over the first memory die.

2. The method of claim 1, further comprising:
transmitting the read or write signals from the first memory die to the second memory die via at least one wire bond between the substrate and the second memory die.

3. The method of claim 1, further comprising:
transmitting the read or write signals from the first memory die to a third memory die of the stacked die package via the interconnect, wherein the third memory die is located over the second memory die.

4. The method of claim 3, further comprising:
transmitting the read or write signals from the first memory die to a third memory die via at least one wire bond between the third memory die and the second memory die.

5. The method of claim 3, further comprising:
transmitting the read or write signals from the first memory die to the third memory die via at least one wire bond between the third memory die and the interconnect.

6. The method of claim 1, further comprising receiving the read or write signals at the first memory die of the stacked die package from the substrate through one or more direct chip attachment features between the first memory die and the upper surface of the substrate.

7. The method of claim 1, wherein an active surface of the second memory die faces away from the first memory die.

8. A stacked die package, comprising:

a substrate;

an interconnect on an upper surface of the substrate;

a first memory die over the substrate having an active surface facing the upper surface of the substrate, wherein the first memory die is communicatively coupled to the substrate via first direct chip attachment (DCA) interconnects, and is directly coupled to the interconnect via second DCA interconnects; and a second memory die over the first memory die, wherein the second memory die is directly coupled to the substrate via first wire bonds, and is directly coupled to the interconnect via second wire bonds;

wherein the first memory die is coupled to the second memory die through the interconnect.

9. The stacked die package of claim 8, wherein an active surface of the second memory die faces away from the first memory die.

10. The stacked die package of claim 9, wherein the first and second wire bonds are coupled to the active surface of the second memory die.

11. The stacked die package of claim 8, wherein each of the first DCA interconnects and the first wire bonds are coupled to the interconnect on the upper surface of the substrate.

12. The stacked die package of claim 8, wherein the first wire bonds are coupled to a first lateral side of the second memory die.

13. The stacked die package of claim 8, wherein the first wire bonds are coupled to both a first lateral side and a second opposite lateral side of the second memory die.

14. The stacked die package of claim 8, further comprising a third memory die over the first memory die, wherein the third memory die is directly coupled to the substrate via third wire bonds.

15. The stacked die package of claim 8, further comprising a third memory die over the first memory die, wherein the third memory die is coupled to the substrate via the second memory die through third wire bonds.

16. The stacked die package of claim 15, wherein the first wire bonds and the third wire bonds are each coupled to an active surface of the second memory die.

17. The stacked die package of claim 8, wherein the first DCA interconnects are configured to receive signals from external devices through the substrate.

18. The stacked die package of claim 8, wherein the second DCA interconnects are configured to transmit signals to the second memory die through the interconnect.

* * * * *